(12) United States Patent
Bockemehl, Jr. et al.

(10) Patent No.: US 8,033,001 B2
(45) Date of Patent: Oct. 11, 2011

(54) CVD SHOWERHEAD ALIGNMENT APPARATUS

(75) Inventors: Joe M. Bockemehl, Jr., Caddo Mills, TX (US); Antonio Ibarra-Rivera, Plano, TX (US); Jason James New, St. Paul, TX (US)

(73) Assignee: Texas Instruments Incorporated, Dallas, TX (US)

( * ) Notice: Subject to any disclaimer, the term of this patent is extended or adjusted under 35 U.S.C. 154(b) by 547 days.

(21) Appl. No.: 12/330,042

(22) Filed: Dec. 8, 2008

(65) Prior Publication Data
US 2009/0165279 A1  Jul. 2, 2009

Related U.S. Application Data

(60) Provisional application No. 61/018,027, filed on Dec. 31, 2007.

(51) Int. Cl.
*B23Q 17/00* (2006.01)
*B25B 27/14* (2006.01)
(52) U.S. Cl. ..................... 29/407.09; 29/281.4
(58) Field of Classification Search ............ 29/428, 29/407.09, 464, 700, 281.5, 721, 281.4, 407.1, 29/466, 468; 118/728, 715; 438/680
See application file for complete search history.

(56) References Cited

U.S. PATENT DOCUMENTS

| | | | |
|---|---|---|---|
| 6,596,133 B1 * | 7/2003 | Moslehi et al. | 204/192.17 |
| 2005/0050708 A1 * | 3/2005 | Huang et al. | 29/428 |
| 2006/0263522 A1 * | 11/2006 | Byun | 427/248.1 |
| 2009/0107403 A1 * | 4/2009 | Moshtagh et al. | 118/728 |

* cited by examiner

*Primary Examiner* — John C Hong
(74) *Attorney, Agent, or Firm* — Wade J. Brady, III; Frederick J. Telecky, Jr.

(57) ABSTRACT

A method and apparatus for aligning a CVD showerhead, comprising engaging a showerhead stem clamp with a showerhead stem outside of a process chamber of the CVD system. An alignment fixture is provided, and a plurality of spacer discs are positioned between the showerhead suspended from a top plate of the CVD system and heated platen. Nuts supporting the showerhead to the top plate are loosened, therein permitting the showerhead to move vertically within the process chamber. The process chamber is closed and the top plate is lowered, wherein the showerhead contacts the plurality of spacer discs. The alignment fixture is engaged with the showerhead stem clamp, therein fixing a vertical position of the showerhead with respect to the top plate, and the top plate is raised. The position of the of the showerhead is then fixed with respect to the top plate via a plurality of standoffs, an adjustment bracket, a threaded rod, and a plurality of nuts.

17 Claims, 11 Drawing Sheets

CVD SHOWERHEAD ALIGNMENT APPARATUS

CROSS-REFERENCE TO RELATED APPLICATIONS

This application claims priority to U.S. Provisional Patent Application Ser. No. 61/018,027 filed Dec. 31, 2007, entitled, "CVD Showerhead Alignment Apparatus".

FIELD OF THE INVENTION

The present invention relates generally to semiconductor processing, and more particularly to an improved method and apparatus for aligning chemical vapor deposition compo-

BACKGROUND OF THE INVENTION

Semiconductor processing typically involves the formation of various layers over a semiconductor wafer or substrate. One particular process involves a formation of an oxide layer over the substrate, wherein the oxide layer is generally deposited via chemical vapor deposition (CVD). A typical chemical vapor deposition system comprises a heated chamber, wherein various components require precise positioning within the chamber. One such component is what is referred to as a "showerhead", wherein the showerhead disperses one or more gases across a wafer positioned on a heated platen. The showerhead disperses gases in a predetermined manner over the wafer at a predetermined pressure and temperature.

A typical showerhead is seen in the Sequel CVD system manufactured by Novellus Systems, Inc. of San Jose, Calif. In the Sequel CVD system, a plurality of showerheads is positioned within a process chamber, wherein the process chamber is generally evacuated during processing of wafers. The process chamber comprises a heated platen on which a plurality of wafers are placed, and wherein the plurality of showerheads are positioned above the plurality of wafers to introduce process gases which generally form the desired layer (e.g., an oxide) over the wafers. Accuracy in the positioning of the plurality of showerheads is important in maintaining process uniformity. Variations in the positions of the showerheads can be seen over time, especially when maintenance to the system is performed.

Accordingly, the showerheads are typically positioned within the chamber and the position is controlled by what is called a "crush ball test", wherein a plurality of balls of foil (e.g., balls of aluminum foil) are placed within the chamber between the platen and the showerheads, and the system is evacuated and placed in conditions similar to actual processing conditions, wherein the balls of foil are subsequently "crushed" between the showerheads and the platen. Once the process conditions are achieved, the crushed balls of foil are removed from the chamber, and a vertical position of the showerheads (e.g., a spacing between the bottom surface of the showerhead and a top surface of the platen) is thus determined by a measurement of the crushed balls of foil using calipers or the like by an operator of the system. The vertical position and alignment of the showerheads are accordingly adjusted based on the measurement of the crushed balls of foil.

The crushed ball measurement has several problems associated therewith. For instance, the measurement of the balls of foil can vary from operator to operator, wherein each operator may apply a differing amount of pressure in measuring the thickness with the calipers. Further, due to the generally delicate nature of the foil used in the measurement, errors in measurements are quite common, due to the removal of the foil, the measurement thereof, and the location of the measurement on the crushed ball of foil.

Thus, an improved method and apparatus for improving showerhead alignment in a CVD system is desirable.

SUMMARY OF THE INVENTION

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

The present invention thus addresses the need for improved control in aligning showerhead-type CVD systems. The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward a method and apparatus for aligning a showerhead in a CVD system. The method and apparatus comprise engaging a showerhead stem clamp with a showerhead stem of the CVD system, wherein the showerhead stem clamp engages the showerhead stem outside of a process chamber of the CVD system. An alignment fixture associated with the showerhead stem clamp is provided, and a plurality of spacer discs are positioned between a showerhead suspended from a top plate of the CVD system and heated platen of the CVD system. Nuts associated with supporting the showerhead to the top plate are loosened, therein generally permitting the showerhead to move vertically within the process chamber. The process chamber is closed and the top plate is lowered, wherein the showerhead contacts the plurality of spacer discs. The alignment fixture is engaged with the showerhead stem clamp, therein fixing a vertical position of the showerhead with respect to the top plate, and the top plate is raised. The position of the showerhead is then fixed with respect to the top plate, via a plurality of standoffs, an adjustment bracket, a threaded rod, and a plurality of nuts.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
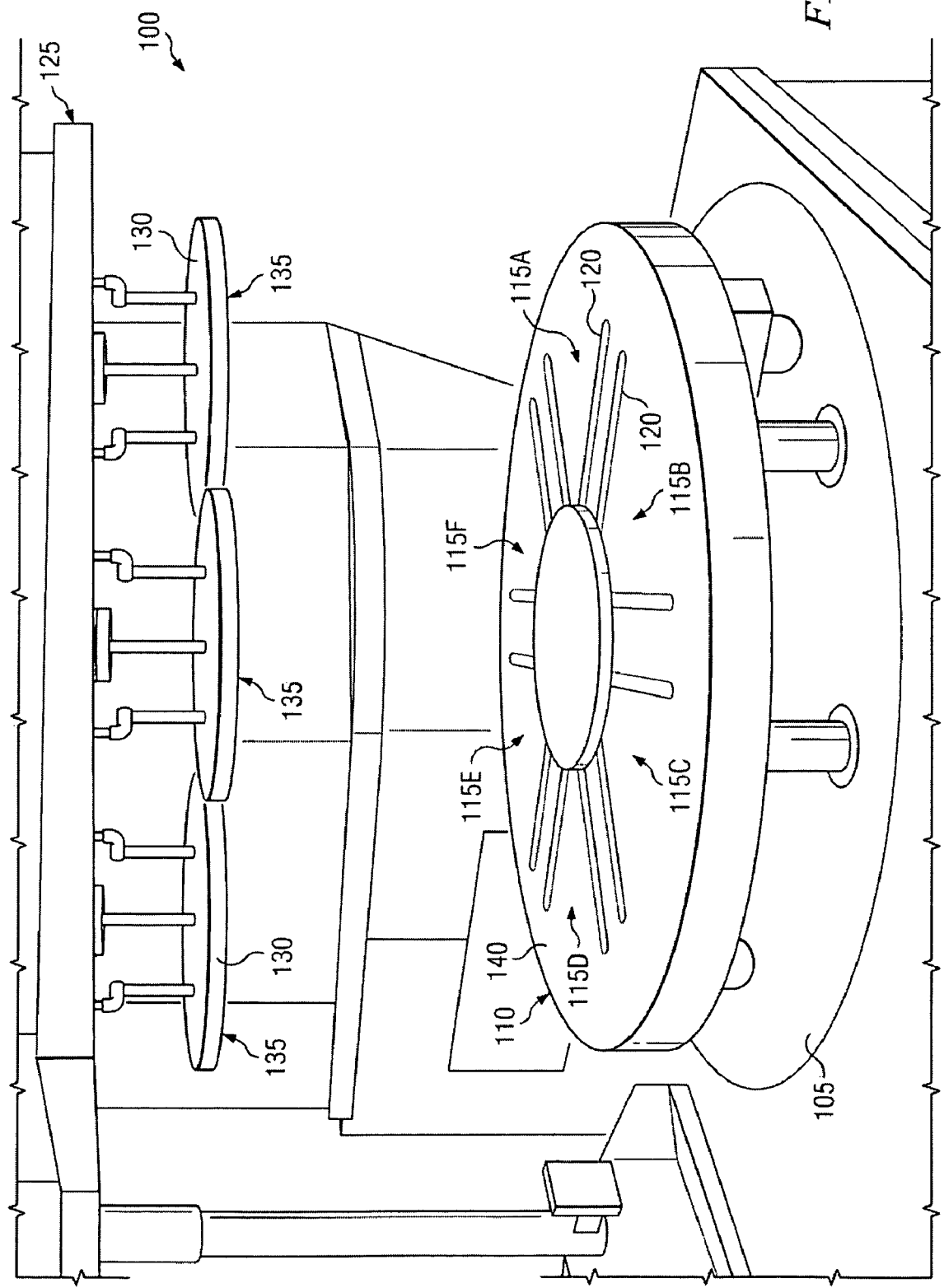
FIG. 1 illustrates a partial perspective view of an interior region of an exemplary CVD system process chamber according to one example of the present invention.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are illustrated in block diagram form in order to facilitate describing the claimed subject matter.

The present invention is generally directed towards a method and apparatus for improving accuracy in alignment of a showerhead in a chemical vapor deposition (CVD) tool. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

In accordance with one aspect of the present invention, an apparatus for maintaining a CVD system (e.g., for deposition of a nitride, oxide or other deposition) is provided, wherein several advantages are provided over the prior art. It should be noted that while one CVD system will be illustrated and described, various other deposition systems are also contemplated as falling within the scope of the present invention, such as a PECVD system, etc. The present invention overcomes several deleterious effects of the use of conventional foil balls previously utilized to align components in the CVD system.

FIG. 1 generally illustrates a CVD system 100, wherein the CVD system comprises a process chamber 105 (illustrated without a side enclosure for purposes of clarity), wherein a plurality of workpieces (not shown) are typically positioned on a heated platen 110 within the process chamber at a plurality of stations 115A-115F. The heated platen 110, for example, is configured to selectively heat the work pieces to a predetermined temperature (e.g., 400° C.), wherein the workpieces are selectively vertically translated via strips 120 to selectively contact the heated platen. For example, during processing, the workpieces are in contact with the heated platen 110.

A moveable top plate 125 is further provided, wherein the plurality of showerheads 130 are generally suspended from the top plate. In order to provide a controllable and repeatable processing of workpieces, a predetermined gap (not shown) between a bottom surface 135 of the plurality of showerheads 130 and a top surface 140 of the heated platen 110, for example, is desired to be constant and uniform for all showerheads during processing (e.g., a gap of 0.465").

Figure 2:
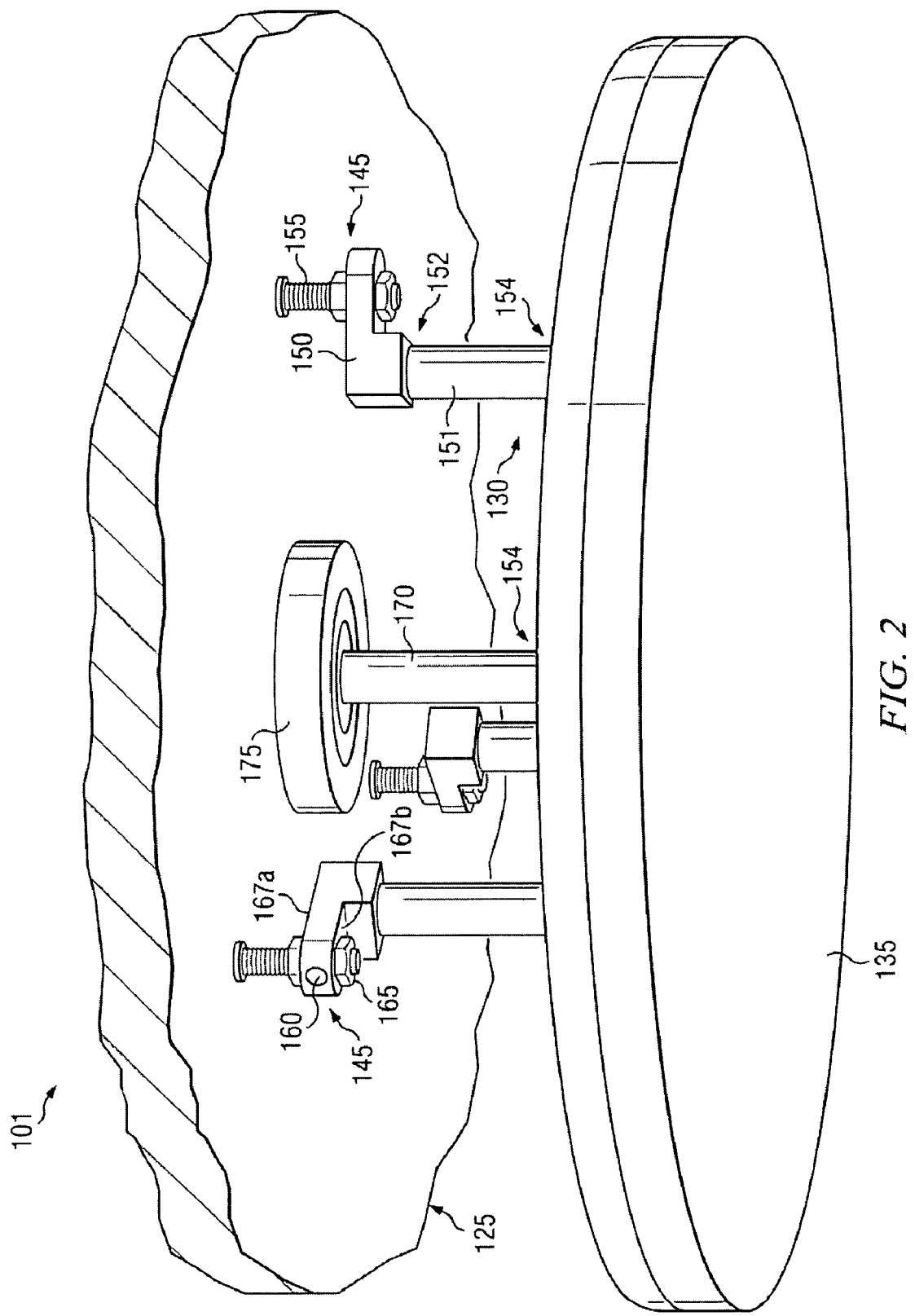
FIG. 2 illustrates a partial perspective view of a showerhead level adjustment assembly according to one exemplary aspect of the invention.

FIG. 2 illustrates a CVD system showerhead level adjustment assembly 101 according to one aspect of the invention. In order to maintain the predetermined gap described above, the plurality of showerheads 130 are adjustably coupled to the moveable top plate 125 by a plurality of adjustment hangers 145 operably coupled to the top plate. For example, each of the plurality of adjustment hangers 145 comprises a hanger bracket 150, wherein a ceramic standoff 151 is fixedly coupled, at the top end 152, to the hanger bracket, and at the bottom end 154, to the plurality of showerheads 130. A threaded rod 155, for example, is fixedly coupled to the moveable top plate 125, wherein each of the plurality of adjustment hangers 145 comprises a thru-hole 160, and wherein a plurality of nuts 165 engage the threaded rod on one or more of a topside 167A or a bottom side 167B of the adjustment hanger, therein selectively positioning the adjustment hanger with respect to the threaded rod upon tightening. It is generally desirable that the bottom surface 135 of the plurality of showerheads 130, for example, be perpendicular to heated platen 110, and the gap (not shown) therebetween be constant for the all of the plurality of showerheads. each of the plurality of showerheads 130, for example, further comprise a showerhead stem 170 extending therefrom, wherein the stem extends through the top plate 125 via a vacuum seal 175. The showerhead stem 170, for example, provides process gases (not shown) to the plurality of showerheads 130 for associated processing of workpieces (not shown).

During processing, the moveable top plate 125 is in a lowered position with respect to the heated platen 110 of FIG. 1, wherein the plurality of showerheads 130 are in close proximity (e.g., the gap—not shown) to the heated platen (and hence, in close proximity to the workpieces—not shown). Conventionally, the gap is measured by placing a plurality of foil crush balls (not shown) between the bottom surface 135 of the plurality of showerheads 130 and the top surface 140 of the heated platen 110 prior to lowering of the moveable top plate 125, wherein typical processing conditions are undertaken (e.g., the top plate is lowered, the process chamber 105 is pumped down to vacuum, and the heated platen is brought to the process temperature), therein deforming the crush balls in an attempt to discern the gap. The moveable top plate 125 is then raised, and the crush balls are removed and measured. However, such a measurement is time consuming and measurement accuracy can vary from technician to technician. Further, any resiliency in the crush balls can affect the measurement, and temperature differences may also affect the measurement, as the gap can vary depending on temperature.

Figure 3:
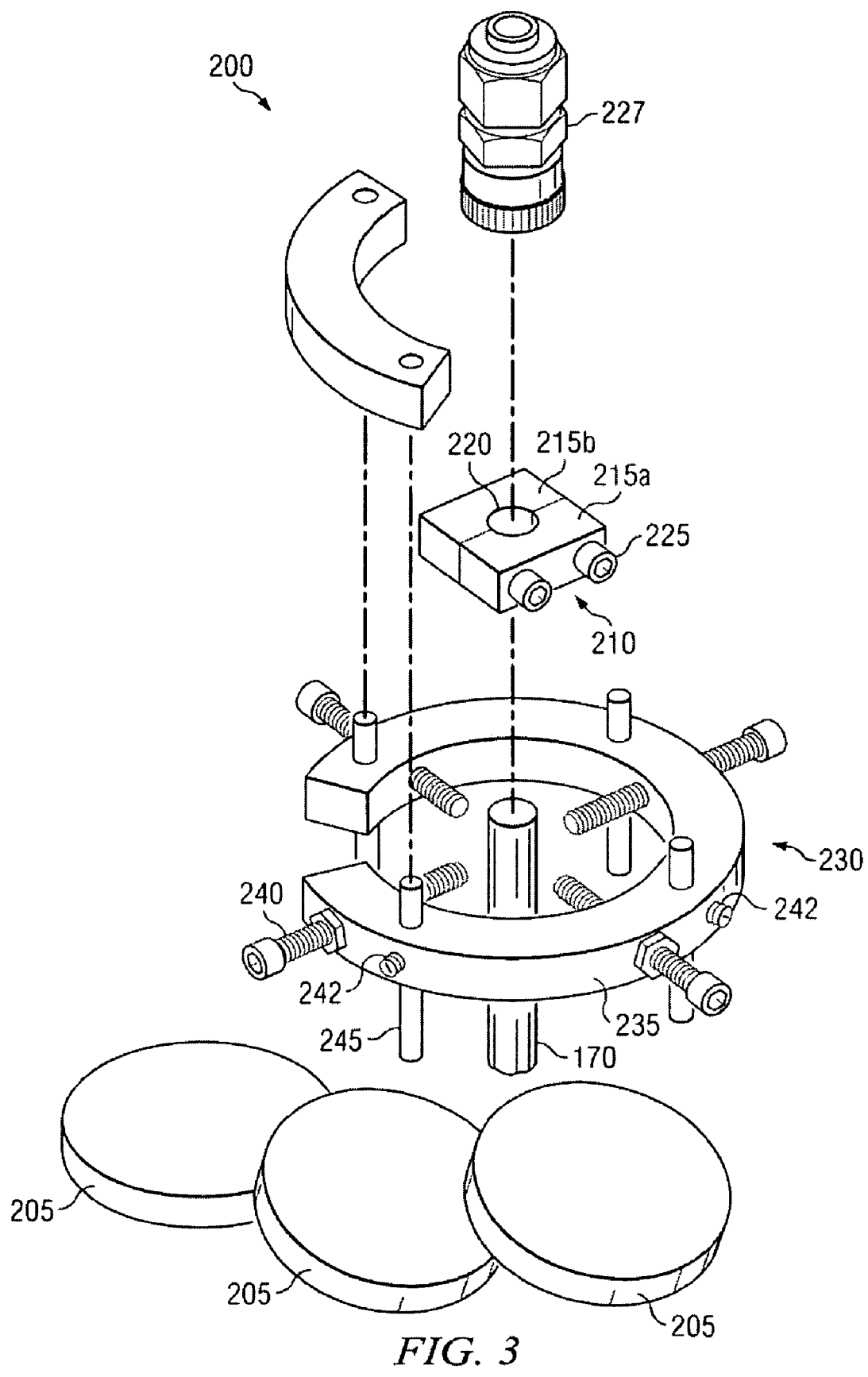
FIG. 3 illustrates an exploded view of an exemplary alignment apparatus according to one embodiment of the present invention.
Figure 9:
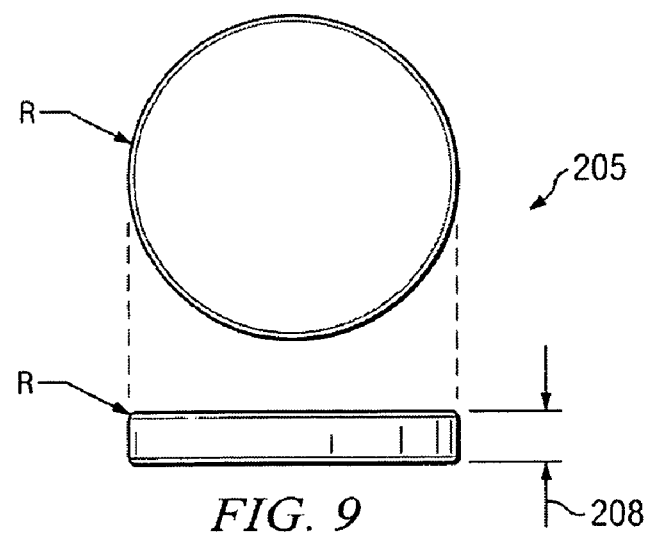
FIG. 9 illustrates an exemplary spacer disc in side and plan views according to another example of the present invention.

FIG. 3 thus illustrates an alignment apparatus 200 according to a first embodiment of the present invention, wherein the alignment of the plurality of showerheads 130 in the CVD system 100 of FIG. 1, or other CVD systems, is provided. The alignment apparatus 200 comprises a plurality of spacer discs 205 configured to be placed, for example, between the heated platen 110 and the plurality of showerheads 130 of the CVD system 100 of FIG. 1. FIG. 9 illustrates the spacer discs 205 in one example, wherein a thickness 208 of the plurality of spacer discs of FIG. 3 is associated with the desired gap or spacing (not shown) between the plurality of showerheads 130 and heated platen 110 of the CVD system of FIG. 1 (and hence, the desired gap or spacing between the showerhead and the workpiece). The spacer discs 205 of FIG. 9, for example, are comprised of a ceramic material, wherein expansion and contraction of the spacer discs is substantially limited. The thickness 208 of the spacer discs 205, for example, is determined for a variety of temperatures such that the plurality of showerheads 130, as illustrated in FIG. 1, can be uniformly aligned at the variety of temperatures (e.g., one set of spacer discs is machined to have a thickness for alignment at ambient temperatures, and another set of spacer discs is machined to have another thickness for alignment at process temperatures). Further, while generally cylindrical spacer discs 205 are illustrated, any shape is contemplated as falling within the scope of the invention.

Figure 10:
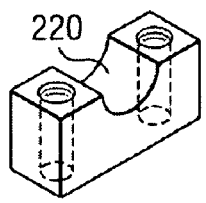
FIGS. 10-11 illustrate perspective views of one exemplary CVD system showerhead stem clamp according to the invention.
Figure 11:
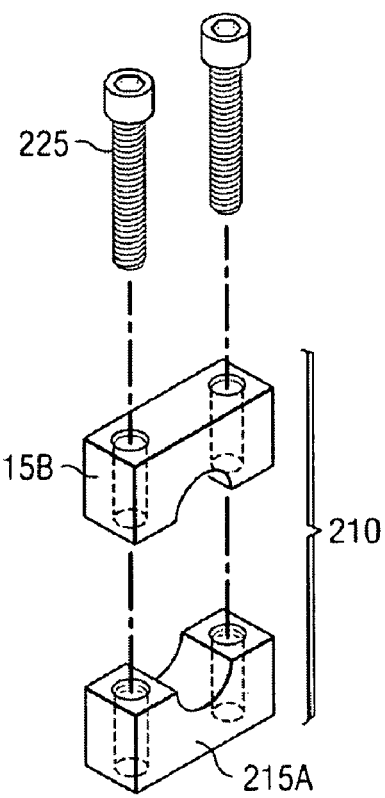

Referring again to FIG. 3, each of the alignment apparatus 200 further comprises a showerhead stem clamp 210, wherein the showerhead stem clamp is configured to engage and generally surround a circumference of the showerhead stem 170 of the respective plurality of showerheads 130 of FIG. 1. In the first embodiment, the showerhead step clamp 210 of FIG. 3 is further illustrated in FIGS. 10 and 11, for example, wherein the showerhead stem clamp comprises two clamping blocks 215A and 215B, wherein a hole 220 is generally defined therebetween. The two clamping blocks 215A and 215B are configured to generally engage the stem 170 of the plurality of showerheads 130 of FIG. 1 via the hole 220 defined between the two clamping blocks. The showerhead stem clamp 210 of FIGS. 3 and 11, for example, further comprises at least one screw 225, wherein the at least one screw threadingly engages one of the two clamping blocks 215A and 215B, therein selectively clamping the two clamping blocks together, and thus engaging the stem 170 via the hole 220.

Figure 5:
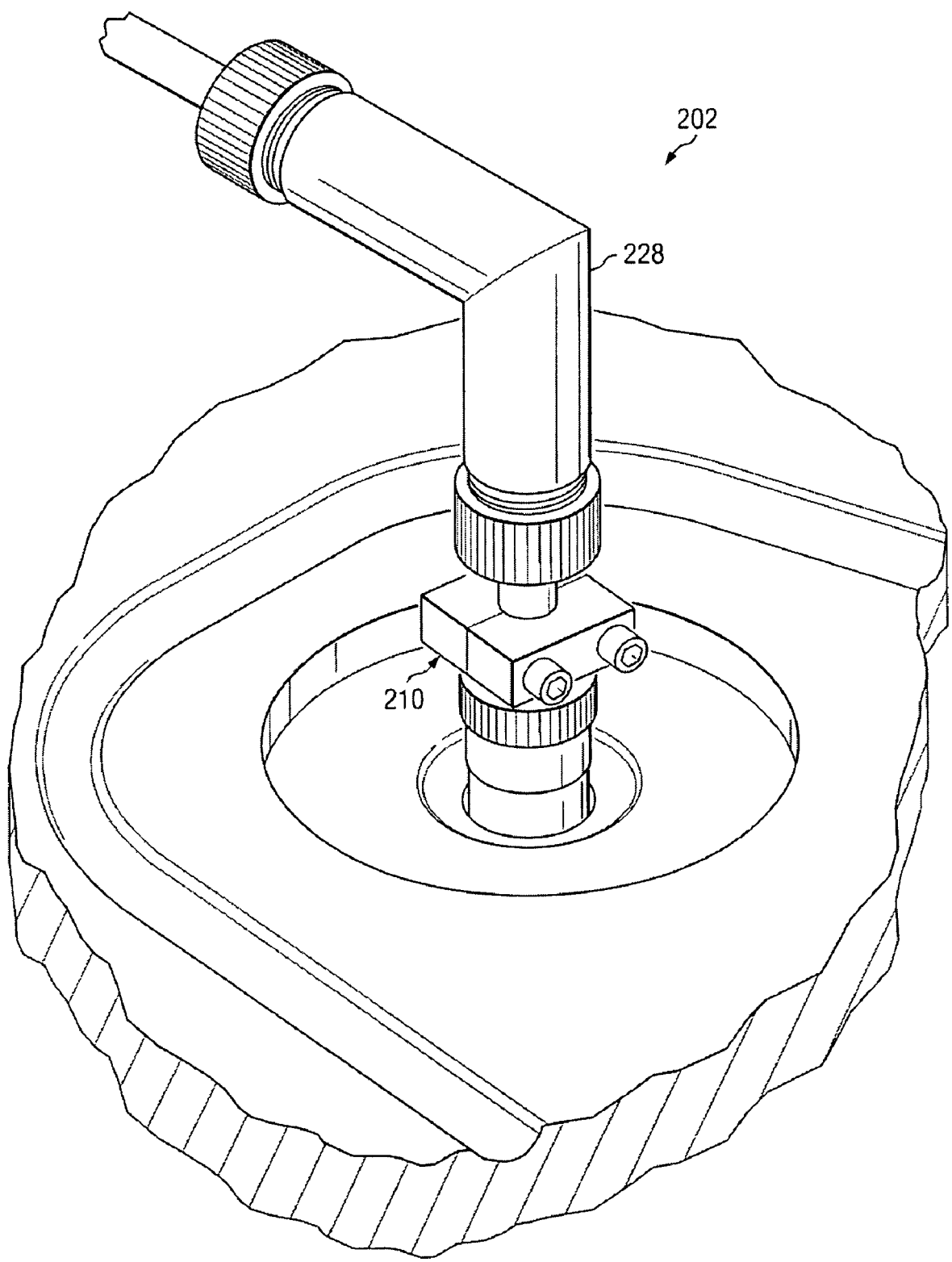
FIG. 5 illustrates a partial perspective view of a showerhead stem clamp operably coupled to a showerhead stem according to another exemplary aspect of the invention.

Additionally, a vacuum cap 227 is applied to stem 170 in order to generally seal the plurality of showerheads 130 from atmosphere during alignment thereof. For example, during CVD processing, each showerhead stem 170 is generally rigidly coupled to a gas supply (not shown) by a coupler 228, as illustrated in FIG. 5. During alignment of the showerhead 130, however, the coupler 228 may prevent proper vertical translation of the showerhead, and thus prevent accurate alignment thereof. Accordingly, the vacuum cap 227 of FIG. 3, for example, is operably coupled to the stem 170 during alignment of the showerhead 130, thus generally both providing a vacuum seal and generally permitting vertical translation of the stem 170 with respect to the moveable top plate 125 of FIG. 1.

The showerhead stem clamp 210 is thus generally configured to engage the stem 170 while generally preventing damage to the stem, o-ring, or vacuum seal 175 of FIG. 2, wherein in the first embodiment, substantially flat surfaces engage one another (e.g., an ID of the hole 220 and an OD of the stem). While the first embodiment of the showerhead stem clamp 210 is illustrated as being generally rectangular in form, the showerhead stem clamp may alternatively take the form of a circle, arc, or any shape; all of which are contemplated as falling within the scope of the present invention.

Figure 15A:
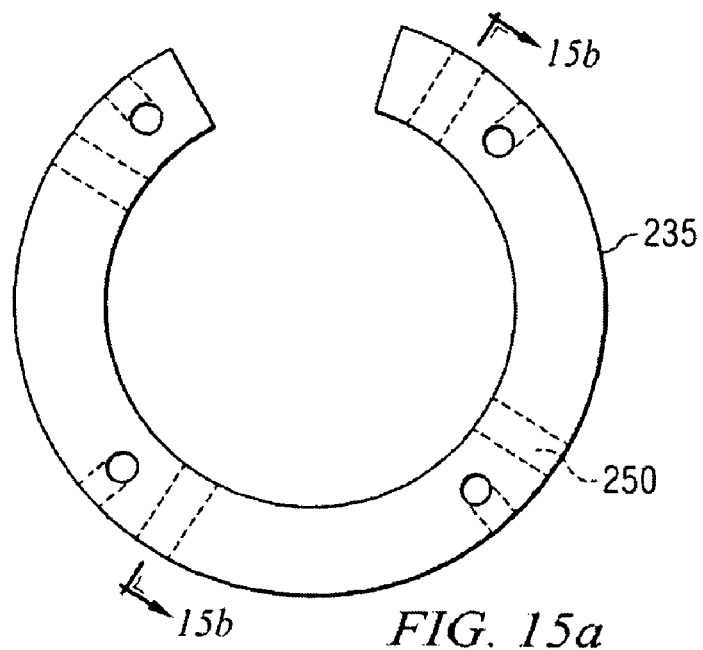
FIG. 15A illustrates a plan view of an exemplary clamp base member according to one aspect of the present invention.
Figure 15B:
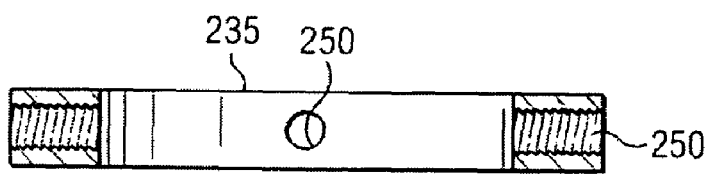
FIG. 15B illustrates a cross-sectional view of the clamp base member of FIG. 15A.

According to the invention, the alignment apparatus 200 comprises an alignment fixture 230 illustrated in FIG. 3, for example, is further provided, wherein the alignment fixture comprises a clamp base member 235, a plurality of screws 240, and a plurality of standoffs 245 operably coupled to the clamp base member and extending generally perpendicularly to the plurality of screws. The plurality of screws 240 threadingly engage a plurality of threaded holes 250, as illustrated in greater detail in FIGS. 15A and 15B, wherein the plurality of threaded holes extend radially through the clamp base member 235, and wherein the clamp base member is configured to at least partially surround the stem 170 of the plurality of showerheads 130 of FIG. 1. In the present example, the plurality of threaded holes 250 of FIGS. 15A-15B are generally equidistantly spaced from one another about the clamp base member 235, therein advantageously providing equal clamping force to the showerhead stem clamp 210 of FIG. 3 when the plurality of screws 240 threadingly engage with the plurality of threaded holes and contact the showerhead stem clamp in an engaged position.

Figure 4:
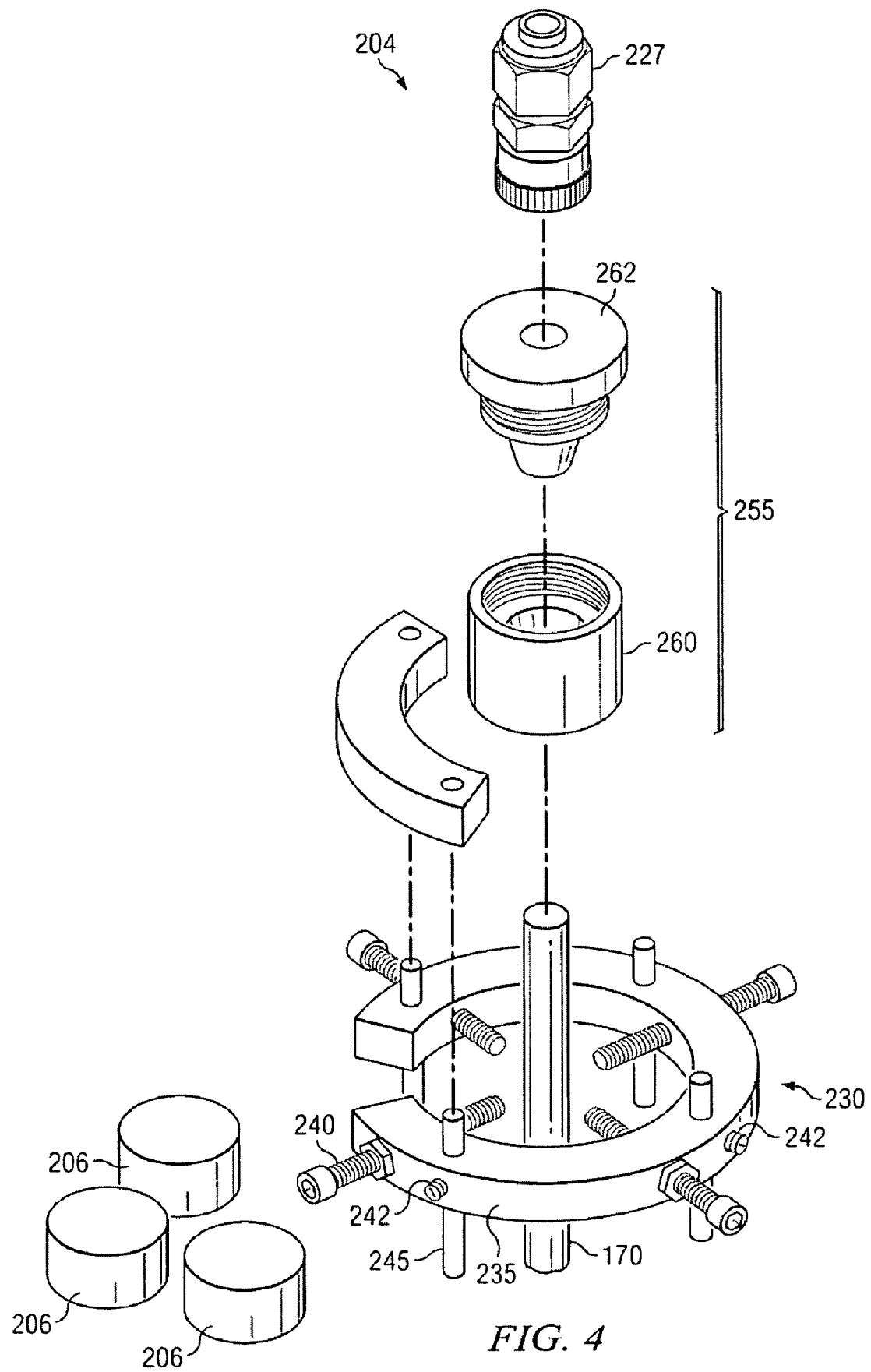
FIG. 4 illustrates an exploded view of an exemplary alignment apparatus according to another embodiment of the present invention.
Figure 12:
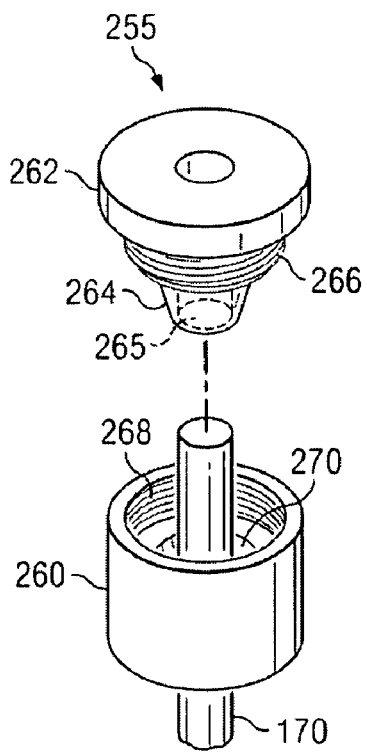
FIG. 12 illustrates a perspective view of another exemplary CVD system showerhead stem clamp according to the invention.
Figure 13:
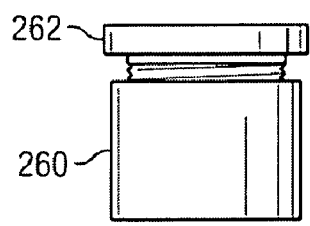
FIG. 13 illustrates a side view of the showerhead stem clamp of FIG. 12.
Figure 14:
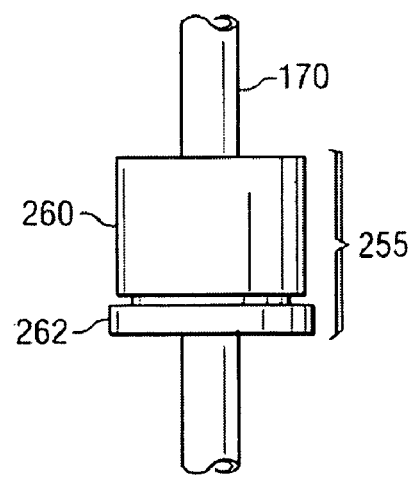
FIG. 14 illustrates the showerhead stem clamp of FIGS. 12-13 operably coupled to a showerhead stem.

FIG. 4 illustrates a second embodiment of the present invention, where another alignment apparatus 204 for maintaining and aligning the plurality of showerheads 130 in the CVD system 100 of FIG. 1 or other CVD system is provided. The alignment apparatus 204 illustrated in FIG. 4, for example, comprises a showerhead stem clamp 255, wherein the showerhead stem clamp comprises a female component 260 and male component 262 configured to pass the stem 170 of the showerhead therethrough via a thru-hole 265. In the present example, the male component 262 of the showerhead stem clamp 255 comprises external threads 266 configured to thread into internal threads 268 of the female component 260 of the showerhead stem clamp 255 of FIG. 12, wherein the showerhead stem clamp generally surrounds a circumference of the stem 170 of the showerhead 130 of FIG. 1.

Additionally, the male component 262 of the showerhead stem clamp 255 comprises a first taper 264 that seats into a second taper 270 of the female component 260 upon the threaded engagement therebetween. Thus, upon tightening, the interface between the first taper 264 and second taper 270 engages with the thru-hole 265 of the male component 262 with the circumference of the stem 170, therein compressing the male component against the stem and generally fixing the showerhead stem clamp 255 to the stem. The showerhead stem clamp 255 is generally configured to engage the stem 170 while further generally preventing damage to the stem, o-ring, or vacuum seal 175 of FIG. 2, wherein substantially flat surfaces engage one another (e.g., an ID of the thru-hole 265 and an OD of the stem). The showerhead stem clamp 255, for example, can be comprised of various materials, such as the male component 262 being comprised of a generally resilient material such a plastic, and the female component 260 being comprised of a metal. Further, while the second embodiment of the showerhead stem clamp 255 is illustrated as being generally cylindrical, it may alternatively take various other forms, such as a square, hexagon, or any shape, and all of which shapes are contemplated as falling within the scope of the present invention.

According to the invention, the alignment fixture 230 of FIG. 4 further comprises the clamp base member 235, plurality of screws 240, and plurality of standoffs 245 coupled to the clamp base member and extending generally perpendicularly to the plurality of screws. In the present example, the plurality of screws 240 engage with the showerhead stem clamp 255 in a manner similar to that described above.

Figure 6:
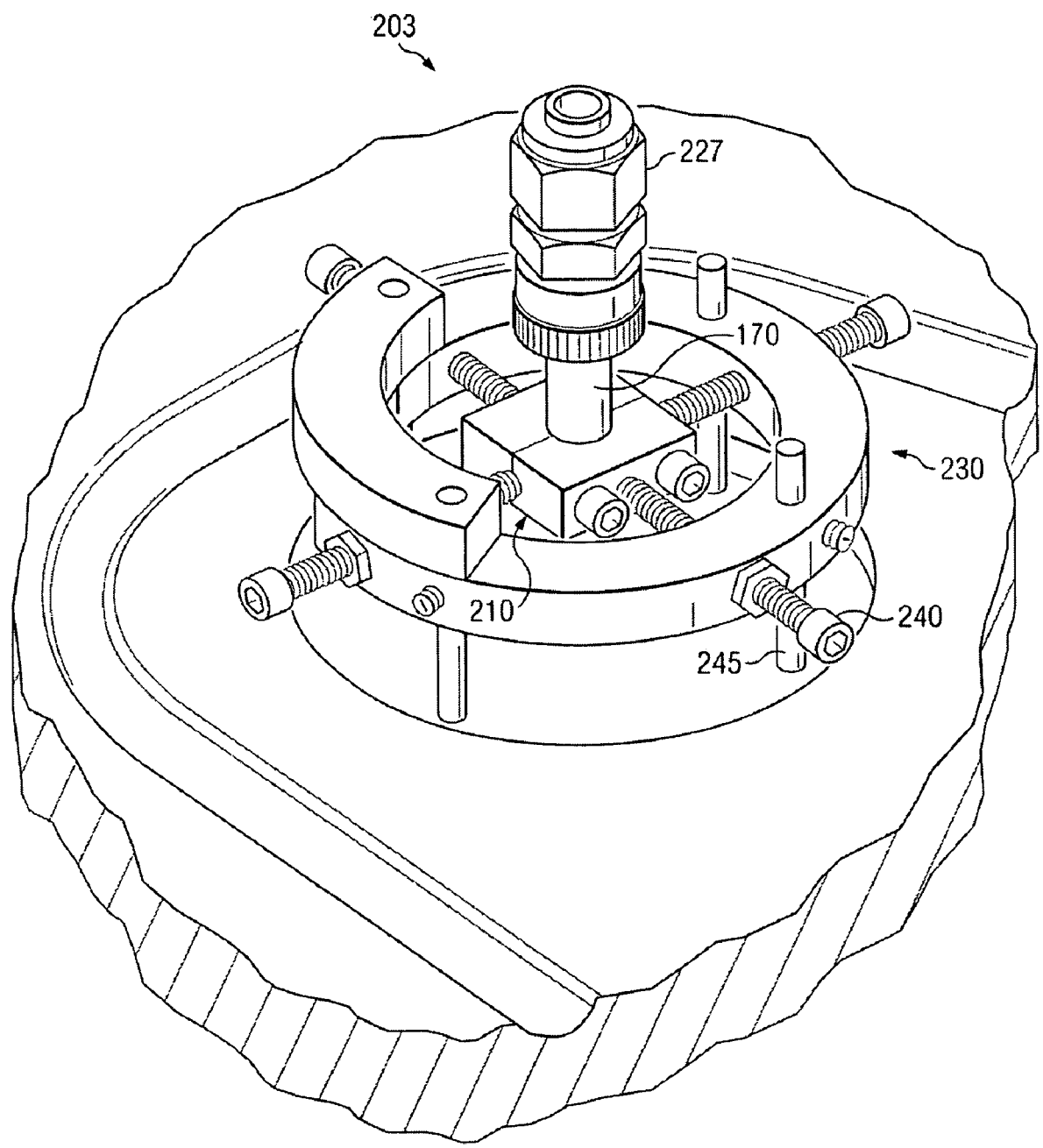
FIG. 6 illustrates a partial perspective view of an exemplary alignment apparatus operably coupled to a showerhead stem in accordance with yet another aspect of the invention.
Figure 7:
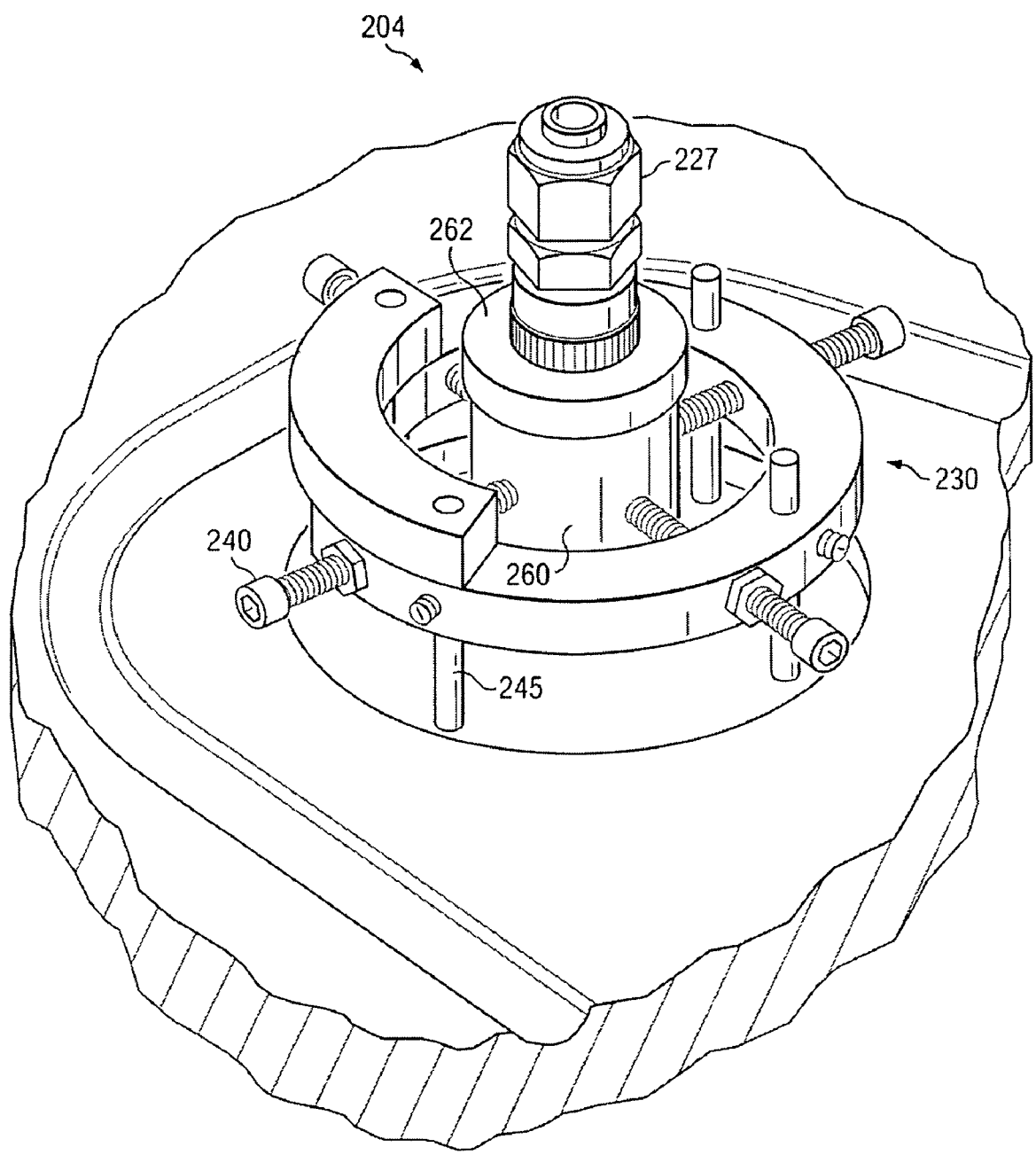
FIG. 7 illustrates a partial perspective view of another exemplary alignment apparatus operably coupled to a showerhead stem in accordance with still another aspect of the invention.
Figure 16:
FIG. 16 illustrates an exemplary standoff according to another aspect of the present invention.

In accordance with another aspect, the plurality of standoffs 245 of FIGS. 3, 4, and 16, for example, are further selectably fixedly coupled to the clamp base member 235 via a respective plurality of set screws 242, wherein the plurality of standoffs are generally equidistantly spaced from one another. Each showerhead stem clamp 210 of FIG. 3 and/or 255 of FIG. 4, for example, engages the respective stem 170 of each of the plurality of showerheads 130 of FIG. 1 outside of the process chamber 105 (e.g., in atmosphere, wherein the showerhead stem clamp is readily accessible), as illustrated in FIG. 5-7. FIG. 5, for example, illustrates the showerhead stem clamp 210 operably coupled to the stem 170, wherein it is not necessary to remove the showerhead stem clamp from the stem during CVD processing.

FIGS. 6-7 illustrate the respective alignment apparatus 203 and 204 of the first and second embodiments, wherein the showerhead of FIG. 2 can be loosely positioned within the chamber via the plurality of nuts 165 and threaded rod 155, such that the showerhead can be vertically translated from outside the process chamber 105 of FIG. 1. The plurality of standoffs 245 of FIGS. 6-7 therein generally permit the stem 170 of the plurality of showerheads 130, of FIG. 2, to be translated in order to align the showerhead, as will be discussed hereafter.

The present invention further provides a method for improving accuracy in aligning showerheads of a CVD system. While example methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 17:
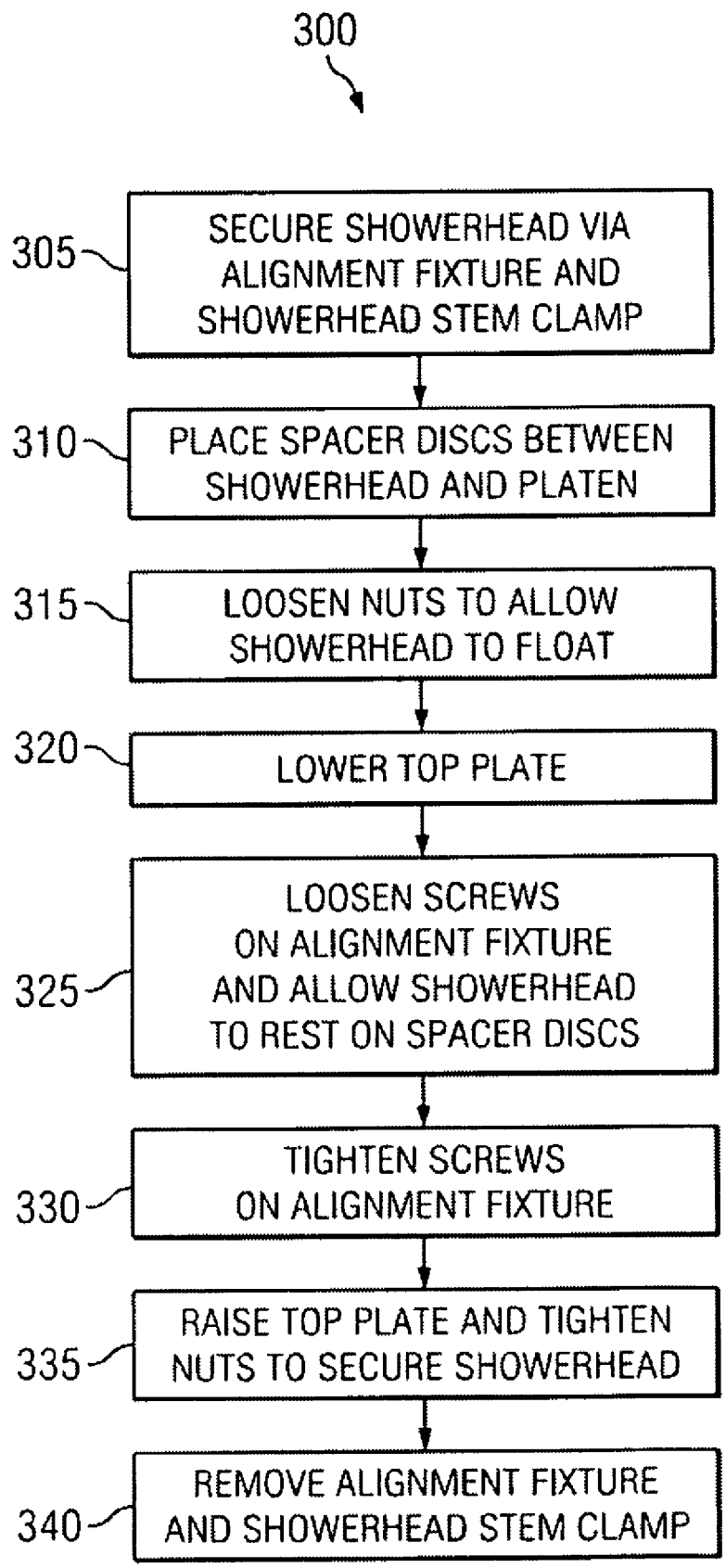
FIG. 17 illustrates a block diagram schematic of a method for aligning a CVD showerhead in accordance with one exemplary aspect of the present invention.

As illustrated in FIG. 17, one example method 300 is illustrated, wherein a CVD system can be aligned utilizing an alignment apparatus, such the CVD system 100 of FIG. 1 and the alignment apparatus 203 and 204 of FIGS. 3 and 4, respectively. In act 305 of FIG. 17, for example, one or more showerheads of a CVD system is secured via an alignment fixture, such as the alignment apparatus 203 or 204 of FIGS. 3 and 4, therein suspending the one or more showerheads within the process chamber of FIG. 1. For example, the showerhead of FIG. 2 is loosely positioned within the process chamber via the loosing plurality of nuts 165 and threaded rod 155, such that the showerhead can be vertically translated from outside the process chamber 105 of FIG. 1. Further, the showerhead stem clamp (e.g., the showerhead stem clamp 210 of FIG. 3) is secured to the stem of the showerhead in act 305 of FIG. 17.

Figure 8:
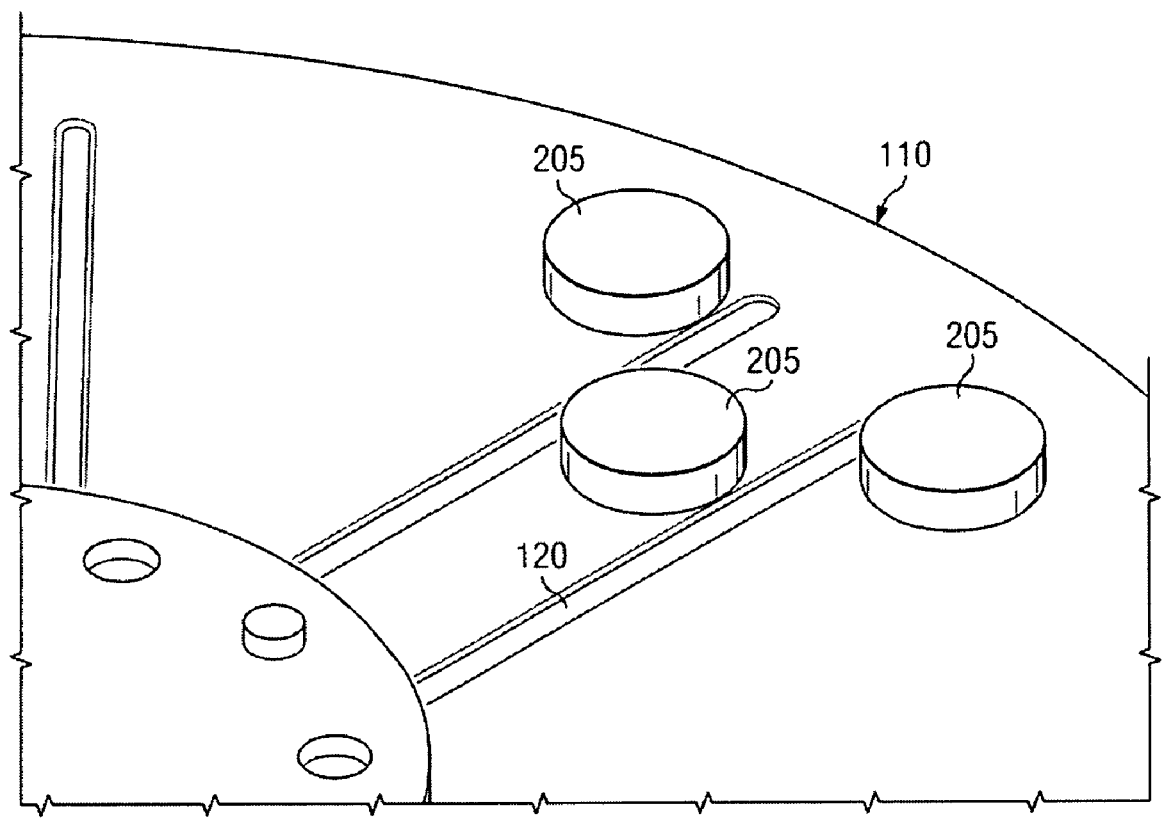
FIG. 8 illustrates a partial perspective view of a platen having exemplary spacer discs residing thereon according to another aspect of the present invention.

In act 310, spacer discs are placed between the showerhead and platen of the CVD system. For example, the process chamber 105 of FIG. 1 is opened, and the spacer discs 205 or 206 of FIG. 3 or 4 are placed between the plurality of showerheads 130 and the heated platen 110 of FIG. 1 For example, the spacer discs 205 of FIG. 3 are placed in alignment with ceramic standoffs 151 of FIG. 2 and between the strips 120 of FIG. 1, as illustrated in FIG. 8. In act 315 of FIG. 17, the plurality of nuts (e.g., the plurality of nuts 165 of FIG. 2) are loosened, therein generally permitting the plurality of showerheads to move vertically within the process chamber. In act 320 of FIG. 17, the top plate is lowered, such as would be performed in readying for semiconductor processing. According to one example, the movable top plate 125 of FIG. 1 is lowered, and the process chamber 105 is evacuated in act 320 of FIG. 17, thus resting the plurality of showerheads 130 of FIG. 1 flat against the spacer discs 205 or 206 of FIG. 3 or 4 respectively. The spacer discs 205 or 206 thus generally permit the bottom surface 135 plurality of showerheads 130 of FIG. 1 to be parallel to the top surface 140 of the heated platen 110 of FIG. 1.

Referring again to FIG. 17, in act 325, a plurality of screws on the alignment fixture are loosened, therein generally permitting the showerhead to rest on the spacer discs. For example, the plurality of screws 240 of FIGS. 6 and 7 are loosened, thus allowing the stem 170 to travel, wherein the plurality of showerheads 130 of FIG. 2 are permitted to rest on the spacer discs 205 or 206 of FIG. 3 or 4 within the process chamber. It should be noted that act 305 of FIG. 17 can immediately precede act 325, such that the vacuum seal 175 of FIG. 2, for example, generally supports the plurality of showerheads 130 prior to the engagement of the alignment fixture 230 and showerhead stem clamp 210 or 260 of FIG. 6 or 7. In act 330 of FIG. 17, the plurality of screws are tightened, thus fixing the vertical position of the plurality of showerheads and stem, with respect to the moveable top plate. In act 335, the top plate is raised and the showerhead is fixed in position. For example, the process chamber brought back to atmospheric pressure, and the top plate is raised in act 335, wherein the plurality of nuts 165 of FIG. 2, for example, are tightened to maintain the position of the ceramic standoffs 151, and thus maintaining the position of the plurality of showerheads 130 with respect to the moveable top plate 125. In act 340 of FIG. 17, the alignment fixture and showerhead stem clamp are removed, wherein the plurality of showerheads 130 of FIG. 2 is properly aligned and ready for processing of work pieces. Alternatively, 340 of FIG. 17 is omitted, wherein one or more of the alignment fixture and showerhead stem clamp remain operably coupled to the CVD system.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated example embodiments of the invention. In addition, while a particular feature of the invention may have been disclosed with respect to only one of several aspects of the invention, such feature may be combined with one or more other features of the other aspects as may be desired and advantageous for any given or particular application. Further-more, to the extent that the term "includes" is used in either the detailed description or the claims, such term is intended to be inclusive in a manner similar to the term "comprising."

What is claimed is:

1. An apparatus for maintaining a CVD system, the apparatus comprising:
    a plurality of spacer discs configured to be placed between a platen and a showerhead of the CVD system, wherein a thickness of the plurality of spacer discs is associated with a desired spacing between the showerhead and platen of the CVD system;
    an alignment fixture, wherein the alignment fixture comprises:
        a clamp base member having a plurality of threaded holes extending peripherally therethrough, wherein the clamp base member is configured to at least partially surround a stem of the showerhead;
        a plurality of screws threadingly engaged with the plurality of threaded holes, wherein the plurality of screws are configured to stabilize the stem of the showerhead; and
        a plurality of standoffs coupled to the clamp base member and extending generally perpendicularly to the plurality of screw.

2. The apparatus of claim 1, wherein the plurality of threaded holes are generally equidistantly spaced from one another about the clamp base member.

3. The apparatus of claim 2, wherein the plurality of standoffs are generally equidistantly spaced from one another.

4. The apparatus of claim 3, wherein a showerhead stem clamp is configured to engage and generally surround a circumference of the stem of the showerhead, therein generally protecting the stem of the showerhead, and wherein the plurality of screws are configured to engage the showerhead stem clamp in an engaged position.

5. The apparatus of claim 4, wherein the showerhead stem clamp comprises a male component and a female component, the male component having a first thru-hole and a first taper, and the female component having a second thru-hole and a second taper, wherein the male component and female are configured to threadingly engage one another, wherein the stem passes through the first thru-hole and second thru-hole, and wherein the threaded engagement generally engages the first taper and second taper, therein generally compressing the male thru-hole against the stem based on the threaded engagement between the male component and female component.

6. The apparatus of claim 3, wherein the clamp base member is generally arcuate in shape.

7. The apparatus of claim 6, wherein the clamp base member is semi-circular.

8. The apparatus of claim 3, wherein the alignment fixture further comprises a stabilizing member, wherein the stabilizing member is configured to selectively engage the clamp base member, therein fully surrounding the stem of the showerhead.

9. The apparatus of claim 8, wherein the stabilizing member selectively engages the clamp base member via a dowel and pin arrangement.

10. The apparatus of claim 3, wherein the showerhead stem clamp comprises two clamping blocks having a hole defined therebetween, wherein the two clamping blocks are configured to engage the stem of the showerhead via the hole defined between the two clamping blocks.

11. The apparatus of claim 10, wherein the showerhead stem clamp further comprises at least one screw, wherein the at least one screw threadingly engages one of the two clamping blocks.

12. The apparatus of claim 3, wherein the plurality of spacer discs are comprised of a ceramic material.

13. A method for aligning a showerhead in a CVD system, the method comprising:
    engaging a showerhead stem clamp with a showerhead stem of the CVD system, wherein the showerhead stem clamp engages the showerhead stem outside of a process chamber of the CVD system;
    providing an alignment fixture associated with the showerhead stem clamp;
    opening the process chamber;
    placing a plurality of spacer discs between a showerhead suspended from a top plate of the CVD system and heated platen of the CVD system;
    loosening nuts supporting the showerhead to the top plate, therein generally permitting the showerhead to move vertically within the process chamber;
    closing the process chamber and lowering the top plate of the CVD system, wherein the showerhead contacts the plurality of spacer discs;
    engaging the alignment fixture with the showerhead stem clamp, therein fixing a vertical position of the showerhead with respect to the top plate;
    opening the process chamber and raising the top plate;
    fixing the position of the showerhead with respect to the top plate via a plurality of standoffs, an adjustment bracket, a threaded rod, and a plurality of nuts; and
    removing the alignment fixture and showerhead stem clamp.

14. The method of claim 13, wherein engaging the alignment fixture with the showerhead stem clamp comprises clamping a clamp base member to the showerhead stem clamp via a plurality of screws.

15. The method of claim 13, wherein placing the plurality of spacer discs comprises placing a spacer disc under each standoff.

16. The method of claim 13, wherein closing the process chamber and lowering the top plate of the CVD system further comprises evacuating the process chamber, therein pulling each showerhead against the plurality of spacer discs.

17. An apparatus for maintaining a CVD system, the apparatus comprising:
    a plurality of spacer discs configured to be placed between a platen and a showerhead of the CVD system, wherein a thickness of the plurality of spacer discs is associated with a desired spacing between the showerhead and platen of the CVD system;
    an alignment fixture, wherein the alignment fixture comprises:
        a clamp base member having a plurality of threaded holes extending peripherally therethrough, wherein the clamp base member is configured to at least partially surround the stem of the showerhead;
        a showerhead stem clamp comprising a female threaded component having a through hole and a male threaded component having a through hole, wherein the female component and the male component are configured to threadingly engage each other and engage the stem of the showerhead via the through hole provided by each showerhead stem clamp component;
        a plurality of screws threadingly engaged with the plurality of threaded holes, wherein the plurality of screws are configured to engage the showerhead stem clamp thereby stabilizing the stem of the showerhead and wherein the plurality of threaded holes are generally equidistantly spaced from one another about the clamp base member a plurality of standoffs coupled to the clamp base member and extending generally perpendicularly to the plurality of screw; and
a stabilizing member, wherein the stabilizing member is configured to selectively engage the clamp base member, therein fully surrounding the stem of the showerhead and wherein the stabilizing member selectively engages the clamp base member via a dowel and pin arrangement.

* * * * *